(12) United States Patent
Saita et al.

(10) Patent No.: US 6,788,537 B2
(45) Date of Patent: Sep. 7, 2004

(54) HEAT PIPE CIRCUIT BOARD

(75) Inventors: Yukihiro Saita, Tokyo (JP); Keiji Mashimo, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 10/431,954

(22) Filed: May 8, 2003

(65) Prior Publication Data

US 2003/0210527 A1 Nov. 13, 2003

(30) Foreign Application Priority Data

May 10, 2002 (JP) ........................................ 2002-135936

(51) Int. Cl.[7] .............................................. H05K 7/20
(52) U.S. Cl. ...................... 361/700; 361/699; 257/714; 257/715; 174/15.1; 174/15.2; 165/80.4; 165/104.26
(58) Field of Search ................................ 361/689, 690, 361/694, 698, 699–704, 707; 165/80.3, 80.4; 174/15.1, 15.2; 257/714, 715; 428/138

(56) References Cited

U.S. PATENT DOCUMENTS

| 4,519,447 | A | * | 5/1985 | Wiech, Jr. ............... 165/104.33 |
| 5,142,441 | A | * | 8/1992 | Seibold et al. .............. 361/689 |
| 5,793,611 | A | * | 8/1998 | Nakazato et al. ........... 361/704 |
| 6,219,237 | B1 | * | 4/2001 | Geusic et al. ............... 361/699 |
| 6,230,790 | B1 | * | 5/2001 | Hemingway et al. ....... 165/80.4 |
| 6,292,366 | B1 | * | 9/2001 | Platt ........................... 361/700 |
| 6,377,457 | B1 | * | 4/2002 | Seshan et al. .............. 361/690 |
| 6,437,981 | B1 | * | 8/2002 | Newton et al. ............. 361/700 |
| 6,490,159 | B1 | * | 12/2002 | Goenka et al. ............. 361/700 |
| 2002/0135980 | A1 | * | 9/2002 | Vafai ........................... 361/700 |

* cited by examiner

*Primary Examiner*—Boris Chervinsky
(74) *Attorney, Agent, or Firm*—Cantor Colburn LLP

(57) ABSTRACT

A heat pipe circuit board comprising: a heat pipe; at least one insulating layer; a circuit pattern provided on a surface of or inside the at least one insulating layer; and electronic components being mounted on the heat pipe through the insulating layer. The heat pipe is formed by jointing two plate members by friction stir welding, at least one of the two plate members being provided with a recess portion which is a fluid channel of a working fluid.

6 Claims, 6 Drawing Sheets

HEAT PIPE CIRCUIT BOARD

BACKGROUND OF THE INVENTION

1. Field of the Invention

The present invention relates to a heat pipe circuit board having its own cooling function for improving the performance of dissipating heat generated by electronic components.

2. Related Art

In these days, as represented by developed personal computers, CPU, electronic devices, other electronic components (hereinafter, these are all referred to as "electronic components") are downsized with significant improvement in performance. As electronic components become more sophisticated, an amount of heat generated by the electronic components is more increased. Therefore, it is now one of most serious technical problems how to efficiently dissipate heat generated by electronic components, to prevent increase in temperature of the electronic components and to keep high performance of the electronic components.

An electronic component is usually mounted on a printed board to constitute a predetermined electronic circuit with other electronic components. The printed board is a thin plate made of an insulating material. On the surface of the printed board, there is printed a metal material with high electrical conductivity, such as copper or the like, so as to constitute a predetermined circuit. The printed board has a hole at a position where an electronic component is mounted, and the electronic component is jointed onto the printed board by soldering or another jointing method to make up a predetermined electronic circuit. However, the printed board itself has low heat conductivity and does not have any particular cooling function.

When an amount of heat generated by electronic components is not large, the heat can be dissipated by natural convection without any particular cooling device being provided. When the heat amount exceeds some degree, it becomes required to actively contain additional heat-dissipating means. Conventionally, as typical heat-dissipating means, there is a method for connecting a heat sink which is made of metal having high heat conductivity. Further, this method is often used in combination with cooling by a cooling fan.

However, recently, as electronic components are more downsized and sophisticated, the demand is growing for a space-saving heat dissipating method having high heat-dissipating efficiency. As a typical cooling method or heat dissipating method, there is a method of using a heat pipe.

When an electronic component is large to some degree, a heat pipe is provided in direct contact with the electronic component. For a small-sized electronic component, a heat pipe is often provided in contact with a printed board on which the electronic component is mounted.

As a typical example of the conventional art, description below is made about a method for cooling a circuit board which is a printed board with electronic components mounted on by bringing a heat pipe in contact with the circuit board.

The heat pipe is typically made of metal having relatively high heat conductivity such as copper or aluminum. Between the printed board and the heat pipe, an insulating material having extremely high heat conductivity is inserted to achieve excellent heat conductivity while keeping electrical insulation.

In addition, the printed board and the heat pipe are jointed by a mechanical joint method, a method of using an adhesive agent or the like. In the case of the method of using an adhesive agent, the adhesive agent also performs the function of the above-mentioned insulating material having high heat conductivity.

Heat generated by electronic components passes through the printed board and the insulating material inserted between the printed board and the heat pipe, then to be transferred to an outer wall of a heat receiving portion of the connected heat pipe. The heat is further transferred from the outer wall of the heat receiving portion of the heat pipe to an inner wall thereof then to be conducted to a working fluid stored in the heat receiving portion in a fluid channel of the heat pipe. The working fluid is vaporized by the conducted heat, and then, the vaporized working fluid is moved to reach a heat dissipating portion of the heat pipe. An outer wall of the heat dissipating portion is provided with heat dissipating fins or the like so as to dissipate heat to the outside.

The vaporized working fluid is deprived of heat by being brought into contact with an inner wall of the heat dissipating portion of the heat pipe, and the heat deprived of from the working fluid is transferred from the inner wall of the heat pipe to the outer wall to be dissipated into the air by external cooling fins or the like. In order to improve heat dissipating efficiency, a cooling fan is sometimes arranged.

The working fluid deprived of heat at the heat dissipating portion is changed from gas back to liquid. The liquefied working fluid flows in the fluid channel back to the heat receiving portion by gravity or capillary force. Then, the above-described cycle is repeated.

Since a heat pipe utilizes evaporation heat of a working fluid, it is a method which enables efficient heat transfer. However, heat generated by electronic components is transferred to a heat pipe via a printed board. Since the heat conductivity of the printed board per se is not as high as that of metal and the like, much thermal resistance exists between the electronic components and the heat pipe. Therefore, even if a high-performance heat pipe is installed, this thermal resistance may prevent heat generated by the electronic component from being dissipated efficiently.

As a typical manufacturing method of a flat-plate-type heat pipe, there is a method of preparing two flat metal plates of which at least one has a recess portion, which is a fluid channel of a working fluid, formed by machine working, bending or the like, jointing the two flat metal plates and injecting a working fluid into the recess portion.

Jointing methods of metal plates include welding, brazing, pressure-bonding and the like. For the case of welding, since raw materials are fused to be jointed, a large amount of heat is given to the metal plates, which results in creating distortion due to the heat in the metal plates. Besides, there occur bumps in a welded portion of the metal plates, which can not be smooth.

Accordingly, it is difficult to have a smooth contact surface between the printed board and the heat pipe, thereby preventing heat from being transferred from the printed board to the heat pipe. In addition, since the metal plates are subjected to high heat in being welded, it is impossible to mount an insulating material on the metal plate in advance or to joint the metal plates after the metal plates are mounted on the printed board.

Further, since in the welding method, there occurs sputtering gas or welding gas and much energy is applied, additional cost, time and effort may be necessitated to create an appropriate clean environment that handles electronic components. Furthermore, the welding method needs additional materials including a welding rod, shielding gas and the like.

In the case of brazing, there is no need to fuse raw materials. However, the brazing method is a high-temperature process at a temperature of 600 degree or higher, which is not higher than the temperature of welding method, but is high enough to produce distortion in the metal plates. Besides, there occur bumps in a brazed portion of the metal plates, which can not be smooth. Therefore, there arise substantially the same problems as those in the welding method.

In the case of pressure-bonding, there does not occur distortion due to exposure to high heat nor bumps due to welding or the like as mentioned above. However, the joint strength in pressure-bonding is lower than that of the other methods, there may arise a problem of leakage of a working fluid in the metal plates. Therefore, this method is not suitable for use in a situation of exposure to thumps, bumps and vibration.

As described above, there are the following problems in the conventional method of cooling a circuit board by providing a heat pipe in contact with the circuit board.

Because of a large thermal resistance of a printed board made of an insulating material, heat generated by electronic components is prevented from being transferred to a heat pipe connected to the printed board. Therefore, it may become impossible to adequately cool ever-increasing heat generated by electronic components.

In addition, since there occurs distortion, bumps or the like in a heat pipe manufactured by welding or brazing, it is impossible to improve adhesiveness between a circuit board and the heat pipe, and therefore, heat generated by electronic components is prevented from being transferred to the heat pipe efficiently.

Further, according to the above-mentioned welding and brazing methods, since plate members comprising a heat pipe are exposed to high temperature, it is impossible to joint the plate members after they are mounted onto a circuit board and the like.

Furthermore, according to the above-mentioned welding and brazing methods, there occurs sputtering gas or welding gas and much energy is applied, which is suitable for the clean environment that handles electronic components. Therefore, additional time, effort and cost may be required to create an appropriate environment.

Still furthermore, a heat pipe manufactured by pressure-bonding does not have such problems as distortion, bumps, high heat in welding and an environmental problem that are shown in the welding and brazing method. However, the joint strength in pressure-bonding is lower than that of the other methods, and therefore, the pressure-bonding method is not suitable for use in a situation of exposure to thumps, bumps and vibration.

SUMMARY OF THE INVENTION

Therefore, it is an object of the present invention to solve the above-mentioned problems to provide a cooling device equipped circuit board which is capable of efficiently cooling heat generated by electronic components and of resisting thumps, bumps and vibration.

The inventors of the present invention have intensively studied in order to solve the above-mentioned problems. As a result, they have found that a heat pipe circuit board described below is capable of transferring heat generated by electronic components to a cooling device more efficiently than the conventional art to enhance cooling performance. In addition, by adopting fiction stir welding which does not generate high heat in jointing, they have achieved a heat pipe circuit board manufacturing method of jointing the heat pipe plates after electronic components are mounted thereon.

A first embodiment of the heat pipe circuit board according to the present invention is a heat pipe circuit board comprising: a heat pipe; at least one insulating layer; a circuit pattern provided on a surface of or inside said at least one insulating layer; and electronic components being mounted on said heat pipe on said insulating layer.

A second embodiment of the heat pipe circuit board according to the present invention is a heat pipe circuit board in which said heat pipe is formed by jointing two plate members by friction stir welding, at least one of said two plate members being provided with a recess portion which is a fluid channel of a working fluid.

A third embodiment of the heat pipe circuit board according to the present invention is a heat pipe circuit board in which said at least one insulating layer takes the shape of a sheet or a plate.

A fourth embodiment of the heat pipe circuit board according to the present invention is a heat pipe circuit board in which said at least one insulating layer is formed by a coating.

A fifth embodiment of the heat pipe circuit board according to the present invention is a heat pipe circuit board in which said at least one insulating layer is strong enough to support said electronic components by itself.

A sixth embodiment of the heat pipe circuit board according to the present invention is a heat pipe circuit board in which said heat pipe includes a cooling surface, said cooling surface performing the function of a mounting bracket for mounting said peat pipe on another member.

A first embodiment of the heat pipe circuit board manufacturing method according to the present invention is a heat pipe circuit board manufacturing method wherein two plate members are prepared, at least one of the plate members being provided with a recess portion which is a fluid channel of a working fluid, electronic components being mounted on at least one of the plate members via an insulating layer, and then, the plate members being jointed by friction stir welding.

Another embodiment of the heat pipe circuit board according to the present invention is a heat pipe circuit board in which said electronic components are mounted on said two plate members via said at least one insulating member.

Still another embodiment of the heat pipe circuit board according to the present invention is a heat pipe circuit board in which said electronic components are mounted on either of said two plate members via said at least one insulating member.

DETAILED DESCRIPTION OF THE PREFERRED EMBODIMENTS

With reference to the drawings, embodiments of the present invention will be described below.

Figure 1:
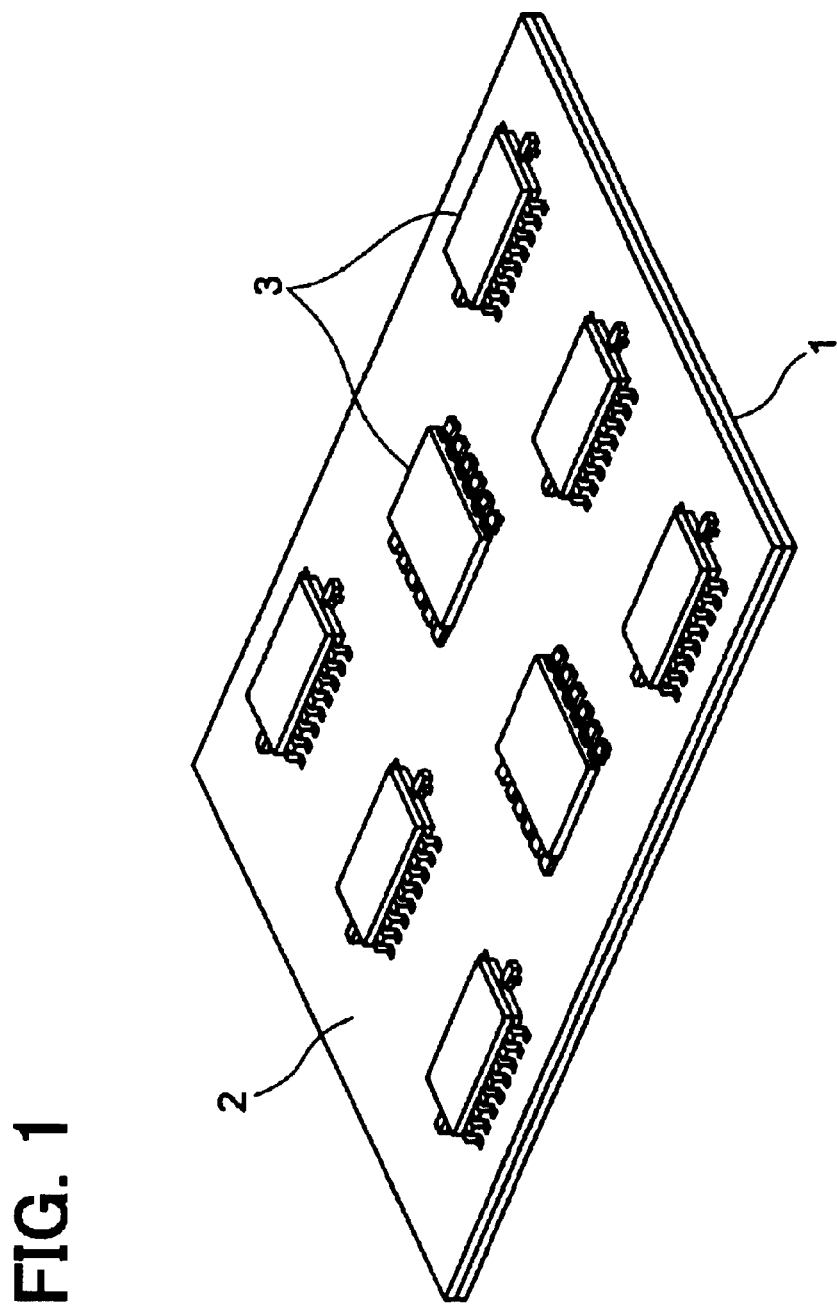
FIG. 1 is a sketch illustrating an example of a heat pipe on which relatively miniaturized electronic components are mounted via an insulating layer having a circuit pattern.
Figure 2:
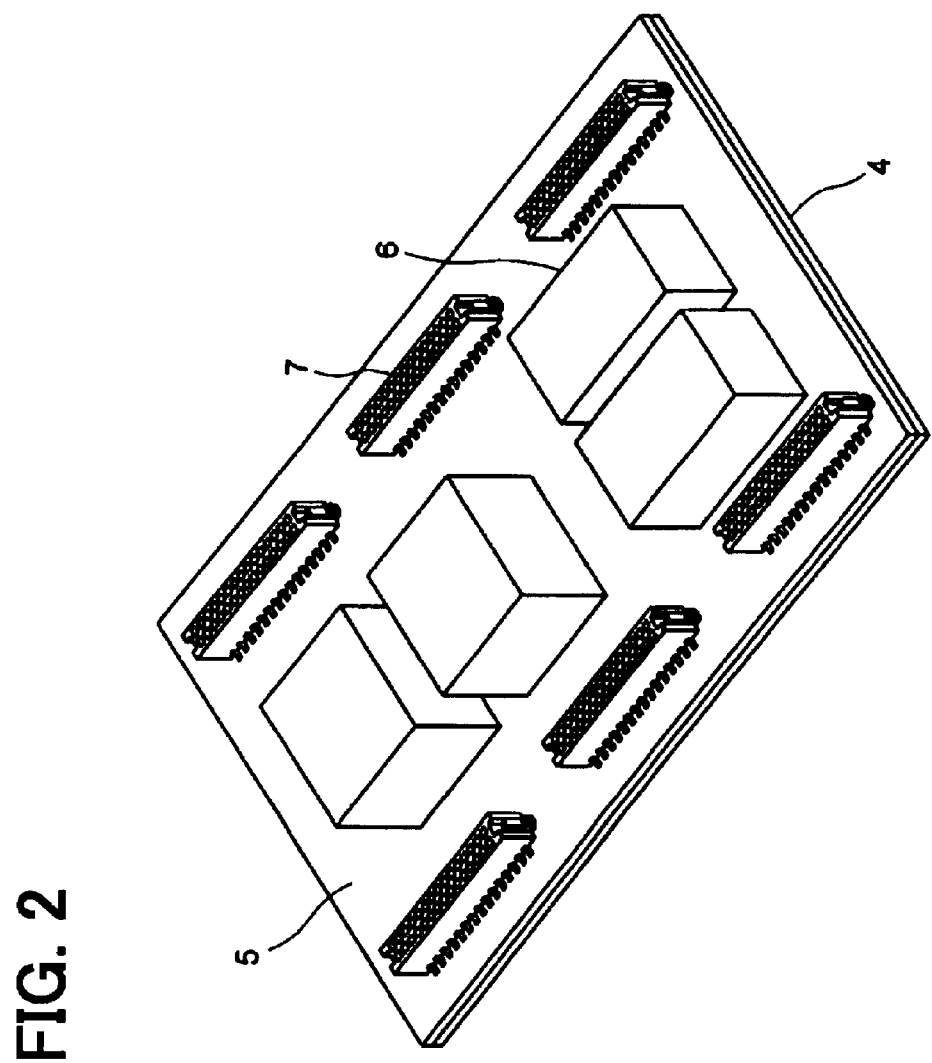
FIG. 2 is a sketch illustrating an example of a heat pipe on which relatively large electronic components and relatively miniaturized electronic components are mounted via an insulating layer having a circuit pattern.

The embodiments of the present invention are shown in FIGS. 1 and 2. FIG. 1 shows an embodiment of a heat pipe 1 on which relatively miniaturized electronic components 3 are mounted via an insulating layer 2 having a circuit pattern;

FIG. 2 shows an embodiment of a heat pipe 4 on which relatively large electronic components 6 and relatively miniaturized electronic components 7 are mounted via an insulating layer 5 having a circuit pattern.

Figure 3:
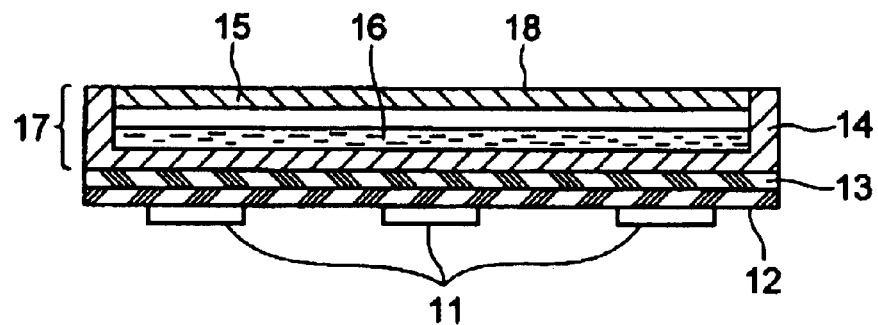
FIG. 3 is a cross sectional view illustrating a configuration of a heat pipe circuit board.
Figure 4:
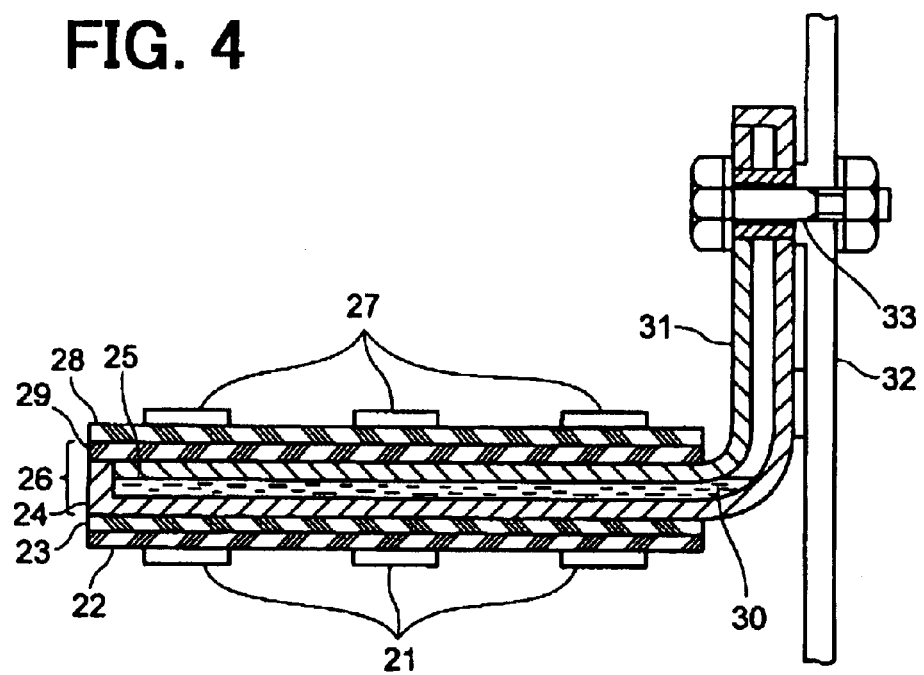
FIG. 4 is a cross sectional view illustrating a configuration of a heat pipe circuit board which is different from that on FIG. 3.

FIGS. 3 and 4 shows cross sections of configurations of heat pipe circuit boards. Both of the embodiments shows a heat pipe formed by jointing two metal plates by friction stir welding, at least one of the metal plates being provided with a fluid channel.

In the embodiment of FIG. 3, electronic components are mounted on one of the two plate members of the heat pipe. The electronic components 11 are mounted on the heat pipe 17 via insulating layers 12 and 13.

The heat pipe 17 is formed by a plate member 14 and a plate member 15 jointed to be one piece. The plate members 14 and 15 are typically made of metal having high heat conductivity, such as copper, aluminum or the like, however the plate members may be made of resin such as plastic or the like. The plate member 14 has a recess portion formed to be a fluid channel of a working fluid. The recess portion is formed by machine working, bending, forging or the like. In the present embodiment, the recess portion is formed only in the plate member 14, however, the recess portion may be formed in each of the plate members 14 and 15.

The plate members 14 and 15 are jointed by friction stir welding. The method for jointing plate members by friction stir welding will be described in detail later. At least one of the plate members 14 and 15 is provided with an inlet for injecting a working fluid into the fluid channel of the working fluid. A predetermined amount of the working fluid is injected from the inlet and the inlet is sealed by the above-mentioned friction stir welding so that the fluid channel is hermetically sealed to be in a vacuum state.

On a surface of or inside the insulating layer 12 a circuit pattern is provided based on each circuit design for electrically connecting given electronic components to constitute an electronic circuit. This circuit pattern is made of a conductive material having high electrical conductivity such as copper. The insulating layer 12 may be in the form of a sheet, a plate or be formed by coating of an insulating material. Particularly, when this circuit board is mounted in an auto mobile, the insulating layer 12 per se is required to be strong enough to support electronic components against severe heat conditions, heavy impact load and frequent occurrence of vibrations in the auto mobile. Electronic components 11 are jointed to the above-mentioned circuit pattern by soldering, mechanical-joint or the like so as to establish electrical connection.

The insulating layer 13 has the function of insulating conductive portions of the circuit pattern or the electronic components from the plate member 14 when the conductive portions are exposed at the plate-member-14-side surface of the insulating layer 12. When the conductive portions are not exposed, the insulating layer 13 has the function of an adhesive agent for adhering the insulating layer 12 and the plate member 14 to one another and the function of enhancing heat conductivity by increasing adhesion degree.

Heat generated by the electronic components 11 is transferred to the plate member 14 via the insulating layers 12 and 13. As compared with the conventional method of contacting a heat pipe to a printed board, thermal resistance is smaller in the present invention and it is possible to cool generated heat efficiently.

Heat is transferred by thermal conduction inside the plate member 14 then to a working fluid 16 stored in the fluid channel. The working fluid 16 is vaporized by the heat and moved to be brought into contact with an inner surface of the plate member 15. An outer surface of the plate member 15 is a cooling plate 18. In necessary, the cooling plate 18 may be provided with heat dissipating fins, may be connected to a heat sink or may be in contact with another heat-dissipating member. Accordingly, the inner surface of the plate member 15 has a temperature lower than that of the vaporized working fluid 16, and then, the vaporized working fluid 16 is deprived of heat when the working fluid 16 is in contact with the inner surface of the plate member 15. The heat deprived of from the working fluid 16 is transferred via the plate member 15 to the outer surface thereof by heat conductivity and dissipated from the surface of the cooling plate 18.

The vaporized working fluid 16 is deprived of heat by the plate member 15 to become liquefied again. The liquefied working fluid is conducted by gravity or capillary force through the fluid channel of the working fluid into the original position where the working fluid was stored. Then, the working fluid is heated by heat conducted from the inner surface of the plating member 14 to be vaporized again, thereby repeating such heating cycle.

FIG. 4 shows an embodiment in which electronic components are mounted on both of two plate members which comprise a cooling device equipped board. These plate members have not only portions for mounting electronic components thereon but also portions which, next to the electronic components-mounted portions, function as cooling surfaces. In the embodiment, the cooling surface portions also function as mounting brackets for mounting the cooling device equipped board per se on another member.

As is the case with the embodiment shown in FIG. 3, electronic components 21 in FIG. 4 are mounted on the heat pipe 26 via insulating layers 22 and 23.

The heat pipe 26 is formed by plate members 24 and 25 jointed to be one piece. In the present embodiment, each of the plate members 24 and 25 is an L-shaped member and consists of an electronic-components-mounted portion and a cooling surface portion. The cooling surface portion is provided on each of the plate members 24 and 25 has in the present embodiment, however, it may be provided on either of the plate members.

The plate member 24 and the plate member 25 are made of metal having high heat conductivity, such as copper, aluminum or the like, however the plate members may be made of resin such as plastic or the like. The plate member 24 has a recess portion formed to be a fluid channel of a working fluid. The fluid channel of a working fluid is formed not only at the electronic-components-mounted portion but also at the cooling surface portion. The recess portion is formed by machine working, bending, forging or the like. In the present embodiment, the recess portion is formed only in the plate member 24, however, a recess portion may be formed in each of the plate members 24 and 25.

The plate members 24 and 25 are jointed by friction stir welding. The method for jointing plate members by friction stir welding will be described in detail later. At least one of the plate members 24 and 25 is provided with an inlet for injecting a working fluid into :the fluid channel of the working fluid. After a predetermined amount of working fluid is injected from the inlet, the inlet is sealed by the above-mentioned friction stir welding so that the fluid channel is hermetically sealed so as to be in a vacuum state.

On a surface of or inside the insulating layer 22 a circuit pattern is provided based on each circuit design, for electrically connecting given electronic components to constitute an electronic circuit. This circuit pattern is made of a conductive material having high electrical conductivity such as copper. The insulating layer 22 may be in the form of a sheet, a plate or be formed by coating of an insulating material. Particularly, when this circuit board is mounted in an auto mobile, the insulating layer 22 per se is required to be strong enough to support electronic components against severe heat conditions, heavy impact load and frequent occurrence of vibrations. Electronic components 21 are jointed to the above-mentioned circuit pattern by soldering, mechanical joint or the like so as to establish electrical connection.

The insulating layer 23 has the function of insulating conductive portions of the circuit pattern or the electronic components from the plate member 24 when the conductive portions are exposed at the plate-member-24-side surface of the insulating layer 22. When the conductive portions are not exposed, the insulating layer 23 has the function of an adhesive agent for adhering the insulating layer 22 and the plate member 24 to each other and the function of enhancing heat conductivity by increasing adhesion degree.

In the present embodiment, the plate member 25, just like the plate member 24, has electronic components 27 mounted thereon via insulating layers 28 and 29. A mounting method is the same as that of the plate member 24. The insulating layer 28 is provided with a circuit pattern like the insulating layer 22. The insulating layer 29 has the same function as the insulating layer 23.

Heat generated by the electronic components 21 and 27 is transferred to the plate members 24 and 25 via the insulating layers 22, 23 and 28, 29, respectively. As is the case with the embodiment shown in FIG. 3, as compared with the conventional method of contacting a heat pipe to a printed board, thermal resistance is smaller in the present invention and it is possible to cool generated heat efficiently.

Heat is transferred by thermal conduction inside the plate members 24 and 25 then to a working fluid 30 stored in the fluid channel. The working fluid 30 is vaporized by the heat and moved up in the fluid channel to the cooling surface portion 31 then to be brought into contact with an inner surface of the cooling surface portion 31. An outer surface of the cooling surface portion 31 is designed to be cooled by dissipating the heat into the air and by dissipating the heat to a body side member 32 connected to the cooling surface portion 31. In necessary, the cooling surface portion 31 may be provided with finer heat dissipating fins. Accordingly, the inner surface of the cooling surface portion 31 has a temperature lower than that of the vaporized working fluid 30, and then, the vaporized working fluid 30 is deprived of heat when the working fluid 30 is in contact with the inner surface of the cooling surface portion 31. The heat deprived of from the working fluid is transferred via the cooling surface portion 31 to the outer surface thereof to be dissipated.

The vaporized working fluid 30, which is deprived of heat by the inner surface of the cooling surface portion 31, becomes liquefied again. The liquefied working fluid is conducted by gravity or capillary force through the fluid channel of the working fluid into the original position where the working fluid was stored. Then, the working fluid is heated by heat transferred from the inner surfaces of the plating members 24 and 25 to be vaporized again, thereby repeating such heating cycle.

The cooling surface portion 31 also functions as a mounting bracket for mounting the heat pipe 26 on the main body and is connected to the body-side member 32 by an insulated bolt nut 33.

Figure 5:
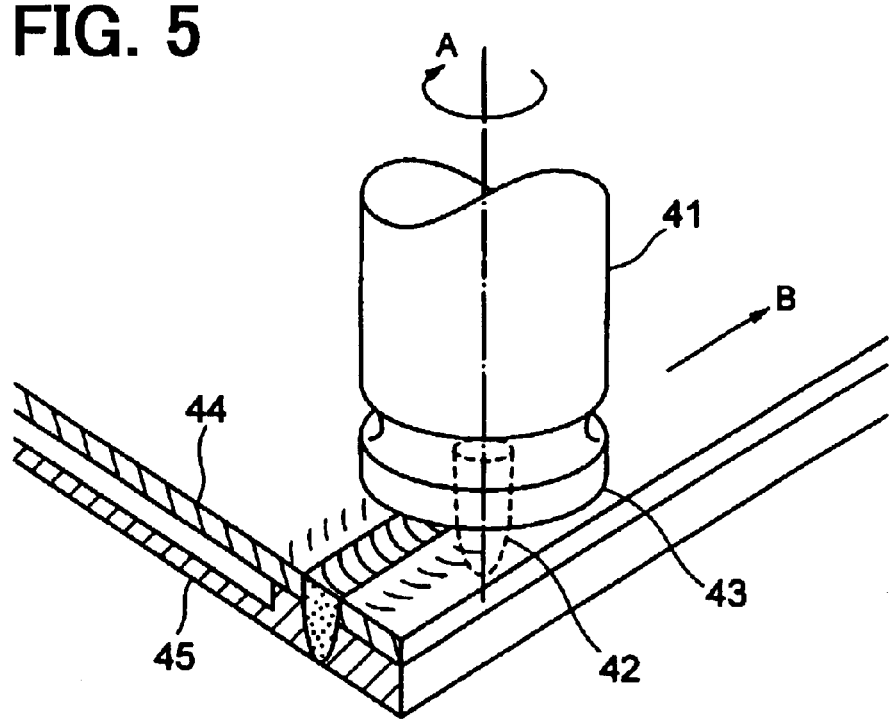
FIG. 5 shows an example of a jointing method by friction stir welding.
Figure 6:
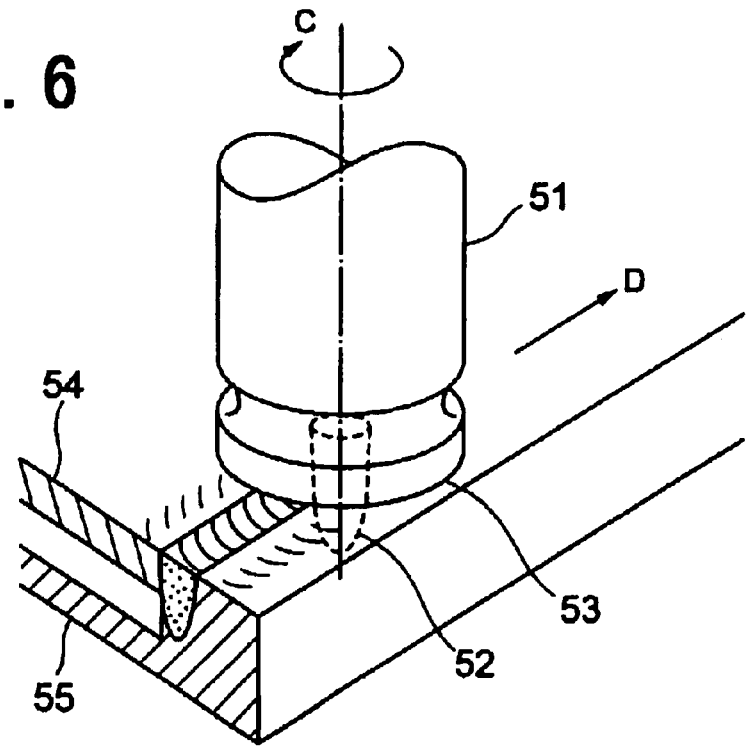
FIG. 6 shows an example of a jointing method by friction stir welding, which is different from that of FIG. 5.

Now, the method for jointing plate members by friction stir welding is described with reference to FIGS. 5 and 6. Jointed materials may be not only metal but also resin such as plastic and the like. The following description is made taking an example of metal. FIG. 5 shows an embodiment of superposing and jointing two metal plates after one of the metal plates has a recess portion, used as a fluid channel of a working fluid, formed by machine working. FIG. 6 shows an embodiment of butt jointing two metal plates after one of the metal plates has a recess portion, used as a fluid channel of a working fluid, formed by machine working, bending or the like.

First, FIG. 5 is used to describe a basic jointing method by friction stir welding. A jointing apparatus for performing friction stir welding includes: an operating device for moving a tool 41 having a probe 42 and a shoulder 43 in the direction of a weld line (direction of the arrow B in FIG. 5) while rotating the tool 41 (in the direction of the arrow A in FIG. 5); and a clamp device (not shown) for clamping two metal plates 44 and 45 together in such a manner that the metal plates are not moved or detached from each other when the probe 42 is inserted into a position where the metal plates 44 and 45 are superposed.

While the tool 41 with the probe 42 and the shoulder 43 is rotated, an end of the probe 42 is inserted into the superposed metal plates 44 and 45 from the upper surface of the metal plate 44. When the probe 42 is being inserted into the metal plates 44 and 45, there is produced frictional heat due to sliding contact between every two of the probe 42, the shoulder 43 and the metal plates 44, 45. Due to this frictional heat, a portion of the metal plates 44 and 45 close to the inserted probe 42 has a temperature reaching a melting point of about 80 degree, and thereby, the portion becomes softened.

Further, rotation of the probe 42 agitates the softened metal. While rotating, the probe 42 is moved along the weld line (in the direction of the arrow B in FIG. 5) together with the tool 41. This movement brings about a fluid pressure effect, and the agitated metal is made to flow to the rearward of the moving direction of the probe 42 so as to fill in a groove formed by passage of the probe 42. The flowing metal then loses the frictional heat to become solidified again. The shoulder 43, which rotates and moves with being in contact with the surface of the metal plate, serves the function of preventing the softened metal material from flying off and the function of producing and holding frictional heat.

In the embodiment of FIG. 5, the metal plate 45 has a recess portion, which is used as a fluid channel of a working fluid, formed in advance by machine working. The two metal plates 44 and 45 are superposed to be jointed.

In the embodiment of FIG. 6, the metal plate 55 has a recess portion, which is used as a fluid channel of a working fluid, formed in advance by machine working, bending or the like. The two metal plates 44 and 45 are not superposed but butt jointed.

In FIG. 6, a jointing apparatus for performing friction stir welding includes: an operating device for moving a tool 51 having a probe 52 and a shoulder 53 in the direction of a weld line (direction of the arrow D in FIG. 6) while rotating the tool 51 (along the direction of the arrow C in FIG. 6); and a clamp device (not shown) for clamping two metal plates 54 and 55 together in such a manner that the metal plates are not moved or detached from each other when the probe 52 is inserted into a position where the metal plates 54 and 55 butt against each other.

While the tool 51 with the probe 52 and the shoulder 53 is rotated, an end of the probe 52 is inserted in the joint surface of the butting metal plates 54 and 55. When the probe 52 is being inserted into the metal plates 54 and 55, there is produced frictional heat due to sliding contact between every two of the probe 52, the shoulder 53 and the metal plates 54, 55. Due to this frictional heat, a portion of the metal plates 54 and 55 close to the inserted probe 52 has a temperature reaching a melting point of about 80 degree, and thereby, the portion becomes softened.

Further, rotation of the probe 52 agitates the softened metal. While rotating, the probe 52 is moved along the weld line (in the direction of the arrow D in FIG. 6) together with the tool 51. This movement brings about a fluid pressure effect, and the agitated metal is made to flow to the rearward of the moving direction of the probe 52 so as to fill in a groove formed by passage of the probe 52. The flowing metal then loses the frictional heat to become solidified again. The shoulder 53, which rotates and moves with being in contact with the surface of the metal plate, serves the function of preventing the softened metal material from flying off and the function of producing and holding frictional heat.

As described above, in the jointing method by friction stir welding, metal in the proximity of an inserted probe has a temperature reaching a melting point of about 80 degree. However, the portion of increased temperature is extremely limited while the other portion has a temperature that is little increased. Since the temperature of the whole metal plates to be jointed is much less increased than that in other jointing methods such as welding and brazing, it is possible to mount electronic components and insulating layers on metal plates before the joint metal plates are jointed by friction stir welding, thereby enabling a flexible circuit-board manufacturing method that was difficult to be realized in the conventional methods.

Figure 7:
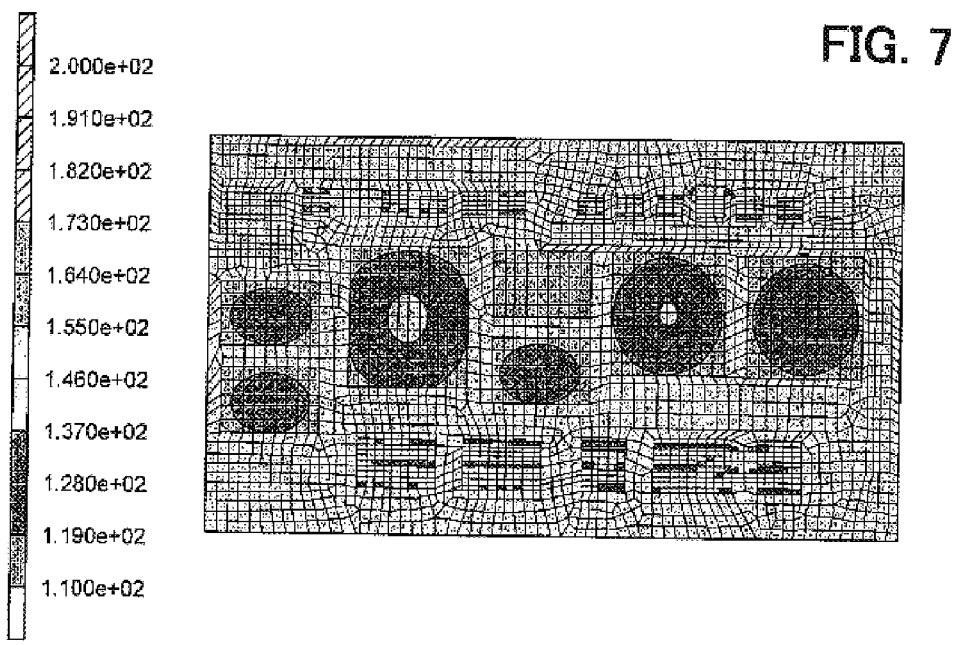
FIG. 7 shows simulation results of temperature distribution of a heat pipe circuit board according to the present invention.
Figure 8:
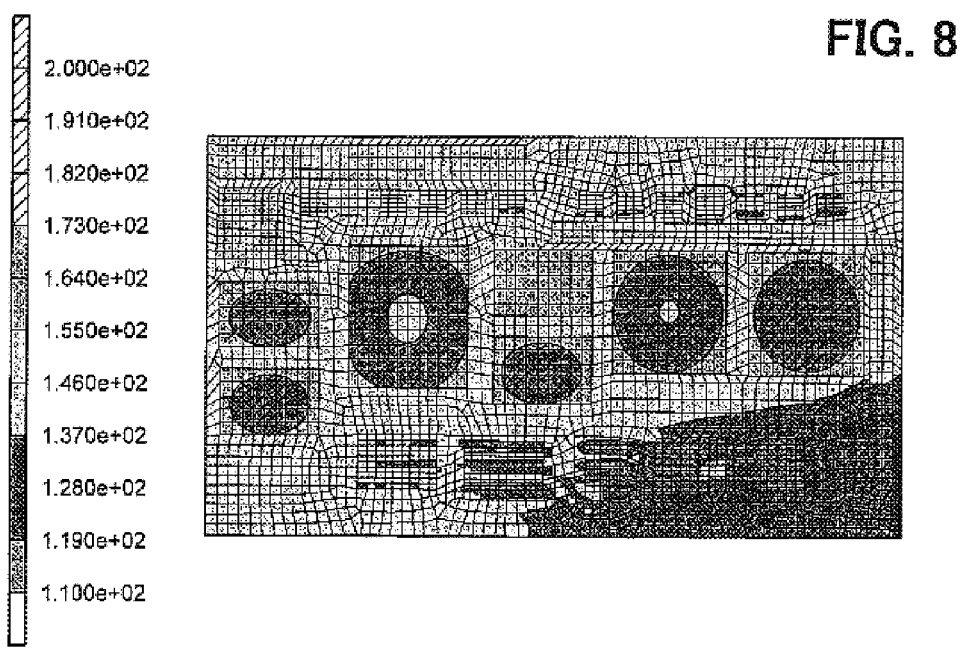
FIG. 8 shows simulation results of temperature distribution of a circuit board which is cooled by being in contact with a heat pipe according to the conventional art.

Next, simulations were performed of a temperature distribution of a heat pipe circuit board according to the present invention and a temperature distribution of a electronic-components-mounted printed board being connected to a heat pipe according to the conventional art, which presents results shown in FIGS. 7 and 8.

FIG. 7 shows, simulation results of a temperature distribution of a heat pipe circuit board according to the present invention. FIG. 8 shows simulation results of a temperature distribution of a conventional circuit board provided in contact with a heat pipe.

As is clear from the simulation results, the temperature distribution of the heat pipe circuit board according to the present invention is made more uniform than that of the conventional art, and there is found no particular part of higher temperature in the temperature distribution of the present invention. Therefore, although the need to enhance the performance of cooling electronic components is growing as the electronic components are more miniaturized and sophisticated in future, the present invention is adequate to serve such a growing need.

As described above, the present invention is allowed to produce the following effects:

As compared with the conventional cooling method by bringing a heat pipe into contact with a circuit board, a heat pipe circuit board according to the present invention is capable of vastly improving cooling performance of heat generated by electronic components. Therefore, according to the present invention, it is possible to be ready for an expected increase of heat which is generated more and more by electronic components due to miniaturization or sophistication of the electronic components in future.

Further, a conventional heat pipe for cooling a circuit board by being in contact with the circuit board was usually manufactured by welding or brazing. Accordingly, there occurred distortion or bumps, which made it difficult to increase adhesiveness between the circuit board and the heat pipe, thereby preventing heat generated by an electronic component from being transferred to the heat pipe efficiently. On the other hand, according to the present invention, since a heat pipe comprising a circuit board is manufactured by friction stir welding, it is possible to realize a heat pipe having a surface with less distortion and bumps than that in the conventional art. Therefore, the heat pipe according to the present invention is high in adhesiveness with mounted electronic component and insulating layer, thereby allowing the heat pipe to achieve high cooling performance.

Furthermore, in the heat pipe manufacturing method by friction stir welding according to the present invention, the heat pipe is not exposed to high heat in jointing, as is different from the conventional method by welding or brazing. Accordingly, jointing is allowed to be performed after electronic components and insulating layers are mounted on the heat pipe in advance, thereby providing the heat pipe manufacturing method with flexibility that was not shown in the conventional art.

Still further, in the heat pipe manufacturing method by friction stir welding according to the present invention, there does not occur sputtering gas nor welding gas which were seen in welding and brazing, and energy taken in the present invention is less than that by welding and brazing. Accordingly, the method of the present invention is suitable for an environment that handles electronic components, eliminating unnecessary expense in time, effort and cost for setting up of the environment.

Still furthermore, the heat pipe manufacturing method by friction stir welding according to the present invention has joint strength higher than that of a manufacturing method by pressure-bonding, and is suitable for usage in an environment where there occur thumps, bumps and vibration.

Therefore, the present invention solves the conventional problems and is allowed provide a heat pipe circuit board for efficiently cooling heat generated electronic components.

What is claimed is:

1. A heat pipe circuit board comprising:
   a heat pipe, said heat pipe being formed by joining two plate members by friction stir welding, at least one of said two plate members being provided with a recess portion which is a fluid channel of a working fluid, said heat pipe including a cooling surface, said cooling surface performing a function of a mounting bracket for mounting said heat pipe on another member;
   at least one insulating layer;
   a circuit pattern provided on a surface of or inside said at least one insulating layer; and
   electronic components being mounted on said heat pipe through said insulating layer.

2. The heat pipe circuit board as claimed in claim 1, wherein said at least one insulating layer takes the shape of a sheet or a plate.

3. The least pipe circuit board as claimed in claim 1, wherein said at least one insulating layer is formed by a coating.

4. The heat pipe circuit board as claimed in claim 1, wherein said insulating layer being strong enough to support said electronic components.

5. The least pipe circuit board as claimed in claim 1, wherein said electronic components are mounted on said two plate members via said at least one insulating member.

6. The heat pipe circuit board as claimed in claim 1, wherein said electronic components are mounted on either of said two plate members via said at least one insulating member.

* * * * *